United States Patent
Trainor et al.

(10) Patent No.: US 6,838,700 B2
(45) Date of Patent: Jan. 4, 2005

(54) ACTIVE MATRIX SUBSTRATE

(75) Inventors: Michael J. Trainor, Horley (GB); John R. A. Ayres, Reigate (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/638,266

(22) Filed: Aug. 8, 2003

(65) Prior Publication Data

US 2004/0066134 A1 Apr. 8, 2004

Related U.S. Application Data

(62) Division of application No. 10/043,537, filed on Jan. 11, 2002, now Pat. No. 6,599,787.

(30) Foreign Application Priority Data

Jan. 11, 2001 (GB) .............................................. 0100733

(51) Int. Cl.⁷ .............................................. H01L 29/04

(52) U.S. Cl. ........................... 257/72; 257/59; 257/360; 257/409

(58) Field of Search ........................... 257/59, 72, 360, 257/409; 438/48, 128, 149, 151, 155

(56) References Cited

U.S. PATENT DOCUMENTS

| | | | |
|---|---|---|---|
| 5,019,002 A | 5/1991 | Holmberg | 445/24 |
| 5,219,771 A | 6/1993 | Miyake | 437/40 |
| 5,220,443 A | 6/1993 | Noguchi | 359/59 |
| 5,585,949 A | 12/1996 | Yamazaki et al. | 349/41 |
| 5,671,026 A * | 9/1997 | Shiraki et al. | 349/40 |
| 5,798,534 A * | 8/1998 | Young | 257/59 |
| 5,930,607 A | 7/1999 | Satou | 438/158 |
| 5,949,502 A * | 9/1999 | Matsunaga et al. | 349/40 |
| 6,013,923 A * | 1/2000 | Huang | 257/59 |
| 6,066,506 A * | 5/2000 | Holmberg et al. | 438/4 |
| 6,111,424 A * | 8/2000 | Bosacchi | 324/770 |
| 6,160,270 A * | 12/2000 | Holmberg et al. | 257/59 |

FOREIGN PATENT DOCUMENTS

| | | |
|---|---|---|
| EP | 0423824 | 4/1991 |
| WO | WO9705654 | 2/1997 |
| WO | WO9713177 | 4/1997 |

* cited by examiner

*Primary Examiner*—Kevin M. Picardat

(57) ABSTRACT

An active matrix substrate includes a row and column array of active elements. Each element is associated with a TFT having a gate electrode connected to a corresponding row conductor and source and drain (electrodes connected to corresponding column conductors. Circuitry for protecting against electrostatic discharge (ESD) is connected to at least one of the row conductors for protecting the TFTs against ESD.

3 Claims, 4 Drawing Sheets

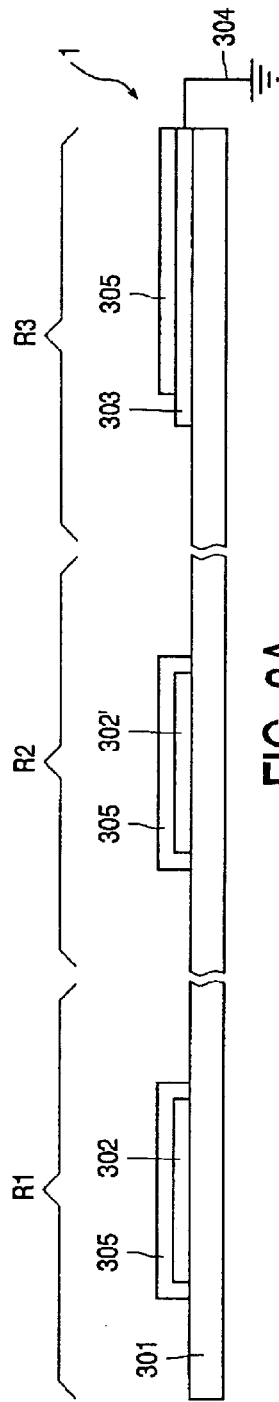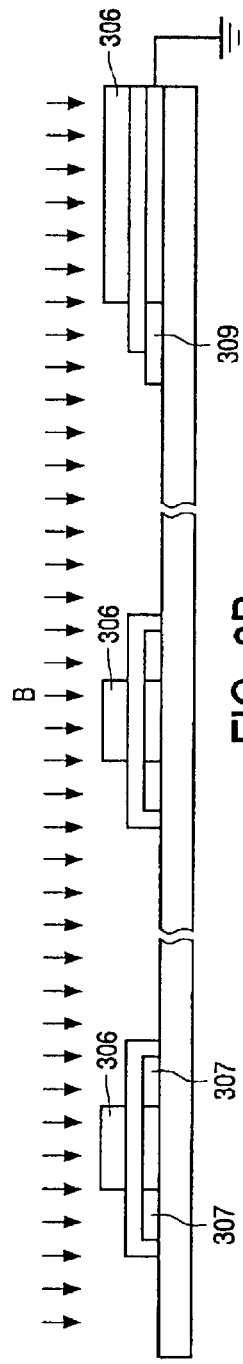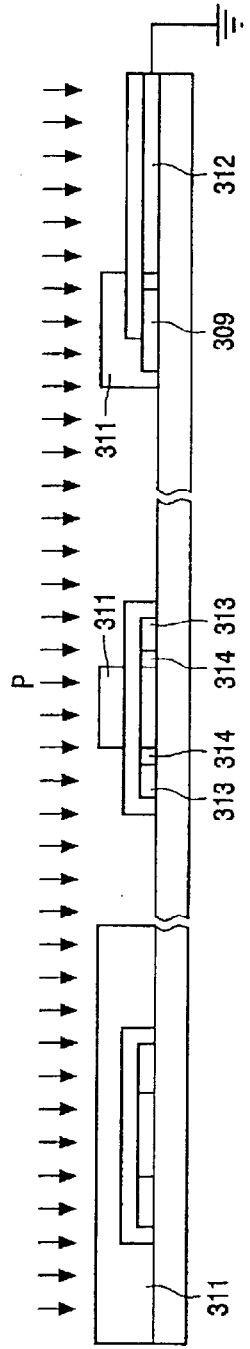

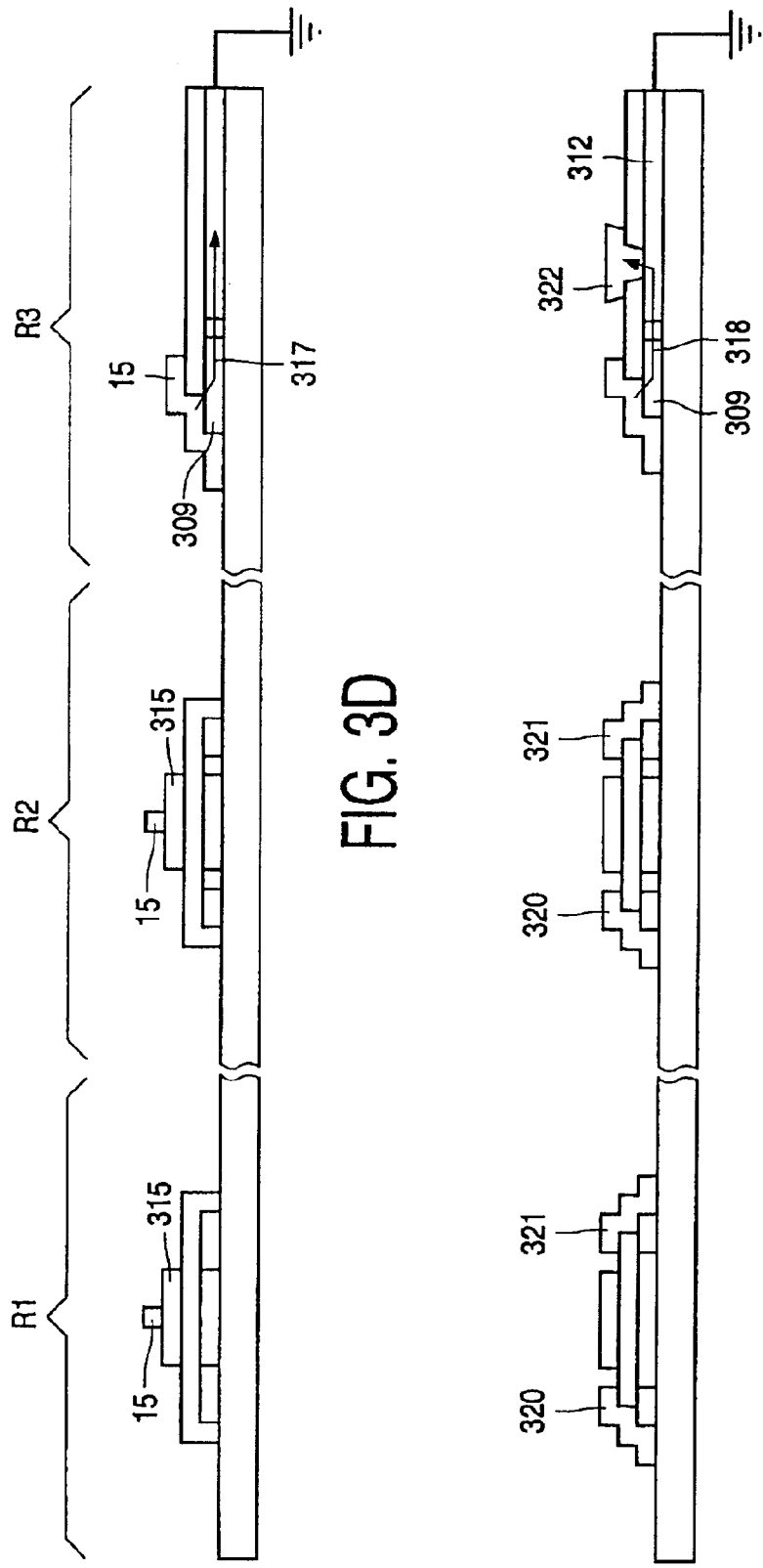

ACTIVE MATRIX SUBSTRATE

This is a division of application Ser. No. 10/043,537 filed Jan. 11, 2002, now U.S. Pat. No. 6,599,787.

FIELD OF TECHNOLOGY

This invention relates to a method of manufacturing an active matrix substrate comprising a row and column array of active elements, each element being associated with a switching thin film transistor (TFT), and ESD protective circuitry connected to the TFTs for protecting against electrostatic discharge (ESD). In particular, but not exclusively, the invention relates to the manufacture of active matrix substrates using complementary metal oxide semiconductor (CMOS) technology, for example, an active matrix liquid crystal display (AMLCD) having CMOS based TFTs switching TFTs or CMOS based integrated row and column driver circuitry.

BACKGROUND AND SUMMARY

The invention is described hereafter with reference to AMLCDs, however, it will be appreciated that the invention is not merely limited to AMLCDs but has application with respect to other types of large area electronic devices such as thin film data stores or image sensors.

As is well known, static electricity has the potential to destroy thin film devices comprising thin dielectric layers and of particular susceptibility to damage are the gate regions of MOS TFTs. With respect to AMLCDs, where TFT gate electrodes are connected to corresponding row conductors and TFT source and drain electrodes are connected to corresponding column conductors, it is known to protect against ESD by providing protective circuitry for regulating the current flow between row conductors and column conductors. For example, this may be achieved by connecting both the row and column conductors to a ground ring via a pair of opposing, partially resistive diodes connected in parallel. Such an arrangement is disclosed in PCT published patent application WO 97/13177 and also U.S. Pat. Nos. 5,585,949 and 5,930,607.

It is an object of the invention to provide a method of manufacturing an active matrix substrate of the type described above in which the performance of ESD protective circuitry is enhanced.

In accordance with the present invention, there is provided a method of manufacturing an active matrix substrate comprising a row and column array of active elements wherein each element is associated with a thin film transistor (TFT) having a gate electrode connected to a corresponding row conductor and source and drain electrodes connected to corresponding column conductors, and ESD protective circuitry connected to at least one of the row conductors for protecting the TFTs against electrostatic discharge (ESD). The method comprises the steps of forming semiconductor regions of the TFTs and the ESD protective circuitry; depositing gate electrodes of the TFTs and corresponding row conductors; and depositing source and drain electrodes of the TFTs and corresponding column conductors, wherein the ESD protective circuitry is operative to control ESD prior to deposition of the column conductors.

Whilst conventional ESD protective circuitry undoubtedly provides AMLCDs with protection against ESD during operation, the inventors have realized that it would be desirable for the ESD protective circuitry to be operative as early as possible during manufacture, and that this may be done prior to deposition of the column conductors.

Prior to deposition of the column conductors, the ESD protective circuitry may be operative to control ESD between the substrate and its external environment and, in particular, operative upon deposition of the row conductors.

This may be achieved by doping a semiconductor region of the ESD protective circuitry so as to provide a gentle conductive path from the part of that semiconductor region connected to a row conductor through that semiconductor region to the external environment of the substrate, and to discourage current flow through that semiconductor region in the opposite direction.

Alternatively, for dissipating negative charge build-up on the substrate, a semiconductor region of the ESD protective circuitry may be doped so as to provide a gentle conductive path from external environment of the substrate, through that semiconductor region and to the part of that semiconductor region connected to a row conductor, and to discourage current flow through that semiconductor region in the opposite direction.

Upon completed manufacture of the active matrix substrate, the ESD protective circuitry may be operative to control ESD in a manner different from that used to control ESD prior to deposition of the column conductors. For example, the ESD protective circuitry may be operative to control ESD between the substrate and its external environment prior to deposition of the column conductors, and operative to control ESD between row and column conductors upon completed manufacture of the active matrix substrate.

The ESD protective circuitry may conveniently comprise either a lateral diode or a lateral, gate shorted TFT connected between row and column conductors and preferably at least one opposing pair of such diodes or TFTs connected in parallel between row and column conductors and, in particular, the semiconductor region of which may comprise two portions located either side of the active region of said diode or TFT, a first portion connected to the row conductor and a second portion on the other side of the active region at least twice and perhaps ten times the size of the first portion.

Further provided in accordance with the present invention is an active matrix substrate manufactured by a method according to the present invention, an active matrix substrate according to any of claims 1 to 3 and an AMLCD comprising such an active matrix substrate.

BRIEF DESCRIPTION OF DRAWINGS

The invention will now be described, by way of example only, with reference to the following drawings in which:

FIGS. 3A to 3E illustrates a method of manufacturing the active matrix substrate of FIG. 1.

DETAILED DESCRIPTION

It should be noted that the drawings are schematic and relative dimensions and proportions of parts of the cross-section views and circuit layout have been exaggerated or reduced in size for the sake of clarity. The same reference signs are generally used to refer to corresponding or similar features in different embodiments.

Figure 1:
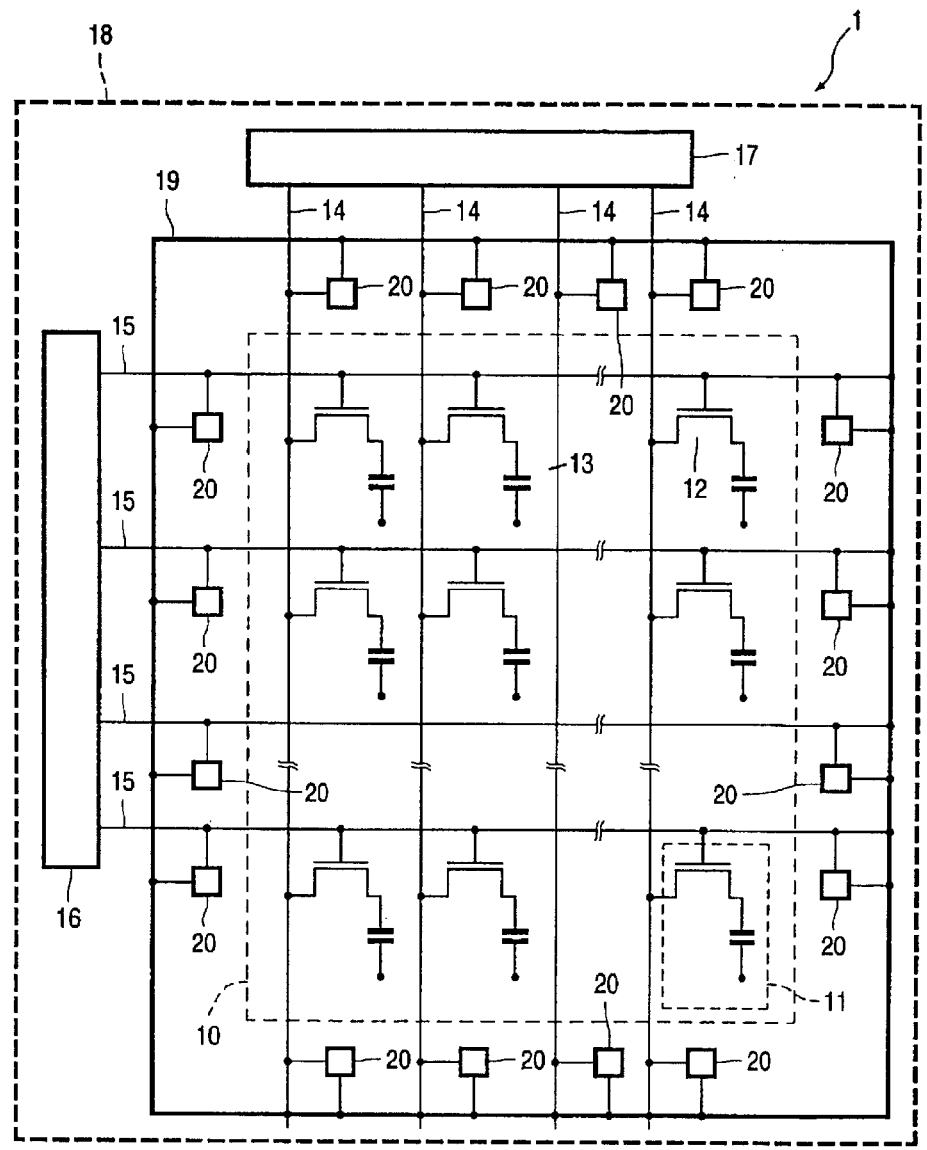
FIG. 1 shows, schematically, an active matrix substrate of an AMLCD having ESD protective circuitry and manufactured in accordance with the present invention.

In FIG. 1, an AMLCD 1 manufactured by a method according to the present invention is shown comprises an display area 10 on a display panel 18, the display area consisting of m rows (1 to m) and n columns (1 to n) of identical picture elements 11. Only a few of the picture elements are shown for simplicity whereas in practice, the total number of picture elements (m×n) in the display area 10 may be 200,000 or more. Each picture element 11 has a picture electrode 12 and associated therewith a switching TFT 13 of the type manufactured by the method illustrated in FIGS. 1A to 1D, and which serves to control the application of data signal voltages to the picture electrode. The switching TFTs 13 have common operational characteristics and are each arranged adjacent to their associated picture element with their respective drain being connected to the picture electrode. The sources of all switching TFTs associated with one column of picture elements are connected to a respective one of a set of parallel column conductors 14 and the gates of all switching TFTs associated with one row of picture elements are connected to a respective one of a set of parallel row conductors 15. The TFTs 13 are controlled by gating signals provided via the row conductors by CMOS based, row driver circuitry 16 located on the display panel 18. Similarly, the TFTs associated with picture elements in the same column are provided with data signal voltages for the picture electrodes by CMOS based, column driver circuitry 26 also located on the display panel. Of course, the operation of picture elements in such AMLCDs is well known and accordingly will not be elaborated upon here further.

Figure 2:
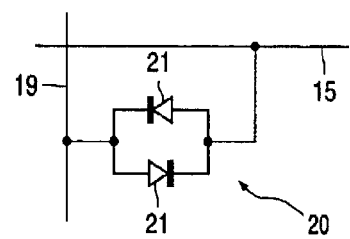
FIG. 2 shows, schematically, the ESD protective circuitry of the active matrix substrate of FIG. 1 in greater detail.

On the AMLCD panel 18, integrated ESD protective circuitry 20 is provided at both ends of both row conductors 15 and column conductors 14, each connecting row and column conductors via a common power rail 19. One such protective circuitry 20 is shown in FIG. 2 in greater detail in which a pair of opposing, lateral p-i-n junction diodes 21, 21' are connected in parallel whereby the voltage across the row and column conductors is regulated by allowing selective current flow in either direction.

A method of manufacturing the active matrix substrate of FIG. 1 is illustrated in FIGS. 3A to 3E including the formation of CMOS p-type (in region R1) and n-type (in region R2) transistors for either the pixel elements or integrated row and column driver circuitry, and a p-i-n diode (in region R3) for the ESD protective circuitry.

Referring to FIG. 3A, on a glass substrate 301, a polysilicon layer is formed and patterned to provide semiconductor device islands 302, 302' for the p-type and n-type transistors respectively and also an extended polysilicon region 303 including the active region of a p-i-n diode and extending to the periphery of the panel 18 where it is electrically connected to ground, external to the substrate. Such electrical connection can be inadvertent electrical contact with the environment, for example through a clamp (not shown) used for securing the glass substrate during the manufacturing process, or deliberate such as a contact pad (not shown) formed in the extended polysilicon region 303 for contacting an external electrical ground connector.

Using conventional manufacturing methods and materials, subsequent masking 306, 311 and doping steps are done as illustrated in FIGS. 3B and 3C to form p-type doped regions 307 of the p-i-p transistor R1, n-type doped regions 313 of the n-i-n transistor R2 including LDD regions 314, and p-type and n-type doped regions 309, 312 of p-i-n diode R3.

Then, as shown in FIG. 3D, gate electrodes 315 of the transistors R1, R2 are provided, conveniently as heavily doped silicon layers connected to the row conductors as shown, or alternatively metal regions integral with the row conductors. Row conductors 15 are deposited so as to connect the gate electrodes to the p-type region 309 of the p-i-n diode R3. After deposition of the gate electrodes 315 and row conductors 15, charge collecting at the TFT gate electrodes is able to dissipate to ground through the p-i-n diode as indicated by the arrow 317. Similarly, the polarity of the diode junction protects the TFTs against ESD originating from the external environment, for example, caused by handling the substrate.

Thereafter, as shown in FIG. 3E, source 320 and drain 321 electrodes for the transistors R1 and R2, column conductors 322 and a ground ring (not shown) connecting row and column conductors. Once the column conductors are formed, the ESD protective circuitry serves to control current flow between the row and column conductors whereby charge collecting at the TFT gate electrodes is able to dissipate to ground through the p-i-n diode as indicated by the arrow 318. The p-i-n diode R3 is one of a pair of opposing, partially resistive diodes connected in parallel whereby the voltage across the row and column conductors is regulated by allowing selective current flow in either direction.

Figure 4A:
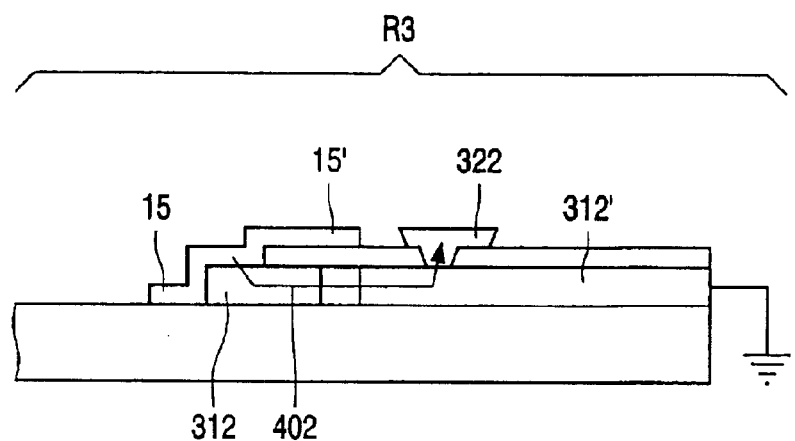
FIGS. 4A to 4C show alternative configurations of the ESD protective circuitry of the active matrix substrate.
Figure 4B:
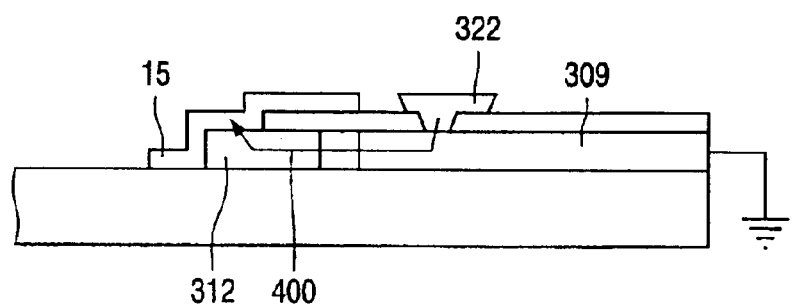
Figure 4C:
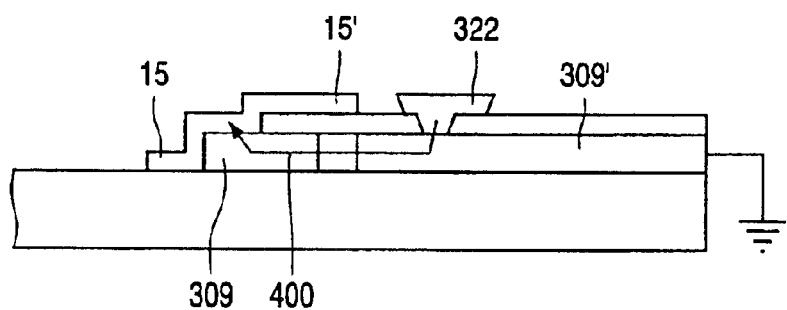

FIGS. 4A to 4C show alternative configurations of ESD protective circuitry. In particular, FIG. 4A shows n-i-n gate shorted TFT structure able to operate in the manner of the p-i-n diode R3 shown in FIGS. 3A to 3E. That is, the n-i-n gate shorted TFT structure enables charge to dissipate through the extended silicon area early in the manufacturing process and control charge flow between row and column conductors after deposition of the column conductors. Similarly, negative charge can be dissipated (in effect, a current flowing on to the plate from the environment) through an n-i-p diode structure or a p-i-p gate shorted TFT structure as shown in FIGS. 4B and 4C respectively.

The dual role of the ESD protective circuitry, that is control charge flow between the plate and the external environment early in the manufacturing process and to control charge flow between row and column conductors after deposition of the column conductors, may to some extent dictate the geometry of the active layer in such ESD protective circuitry. For example, for a p-i-n structure as illustrated in FIG. 3E, the n-type portion 312 of the diode structure which extends towards the periphery of the substrate may be much greater in size than the p-type portion 309 of the diode structure, for example, twice, 5 times or even ten times greater. The converse would apply for the n-i-p structure shown in FIG. 4B where the n-type portion 312 of the diode structure is much smaller than the p-type portion 309, the charge flow as indicated by the arrow 400 being reversed. Similarly, n-i-n and p-i-p gate shorted TFT structures having n-type 312 and p-type 309 portions, as illustrated in FIGS. 4A and 4C respectively, have one doped portion 309', 312' much greater in size than the other doped portion 309, 312.

Being entirely conventional and for the sake of brevity and clarity, further discussion and illustration of the manufacture of the remainder of the AMLCD including for example color and polarizing filter layers, liquid crystal material, spacers and physical protection layers is omitted. Of course, the specific considerations for the practical manufacture of thin film transistors and of active matrix devices incorporating the same will be apparent to those skilled in the art, and the considerations which should be applied for active matrix substrate designs should also be applied for design of an active matrix substrate in accordance with the invention. The precise process conditions which may be appropriate have not been described in this text, as this is a matter of normal design procedure for those skilled in the art.

What is claimed is:

1. An active matrix substrate comprising:
    a row and column array of active elements wherein each element is associated with a thin film transistor (TFT) having a gate electrode connected to a corresponding row conductor and source and drain electrodes connected to corresponding column conductors; and
    protective circuitry connected to at least one of the row conductors for protecting the TFTs against electrostatic discharge (ESD); wherein
    the protective circuitry comprise at least one of either a lateral diode or a lateral, gate shorted TFT connected between row and column conductors; and wherein
    the semiconductor region of at least one of a lateral diode or a lateral, gate shorted TFT of the protective circuitry comprises a first portion, located on one side of the active region of the diode or TET, connected to the row conductor, and a second portion, located on the other side of the active region, at least twice the size of the first portion.

2. An active matrix substrate 1 according to claim 1 wherein the second portion is at least ten times the size of the first portion.

3. An active matrix substrate according to claim 1 wherein the protective circuitry comprises at least one opposing pair of either lateral diodes or lateral, gate shorted TFTs connected in parallel between row and column conductors.

* * * * *